United States Patent
Lee

(10) Patent No.: US 9,438,410 B2
(45) Date of Patent: Sep. 6, 2016

(54) SEMICONDUCTOR APPARATUS AND SYSTEM

(71) Applicant: SK hynix Inc., Icheon-si Gyeonggi-do (KR)

(72) Inventor: Jung Hwan Lee, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/673,168

(22) Filed: Mar. 30, 2015

(65) Prior Publication Data

US 2016/0173270 A1  Jun. 16, 2016

(30) Foreign Application Priority Data

Dec. 15, 2014 (KR) ........................ 10-2014-0180333

(51) Int. Cl.
*H04L 7/033* (2006.01)
*H04L 7/00* (2006.01)
*H04L 7/04* (2006.01)
*H03K 3/356* (2006.01)

(52) U.S. Cl.
CPC ............. *H04L 7/0091* (2013.01); *H03K 3/356* (2013.01); *H04L 7/04* (2013.01)

(58) Field of Classification Search
USPC ........................... 375/362; 345/175; 315/312
See application file for complete search history.

(56) References Cited

U.S. PATENT DOCUMENTS

| 6,493,162 B1 * | 12/2002 | Fredrickson ..... G11B 20/10009 360/46 |
| 8,918,686 B2 * | 12/2014 | Lai .................. G01R 31/31937 714/721 |
| 2011/0121761 A1 * | 5/2011 | Zhao .................. H05B 33/0818 315/312 |
| 2012/0229212 A1 * | 9/2012 | Konecny ............... H03F 3/2173 330/251 |
| 2014/0313166 A1 * | 10/2014 | Rattray ................ H04N 9/3179 345/175 |

FOREIGN PATENT DOCUMENTS

KR    1020060001497 A    1/2006

* cited by examiner

*Primary Examiner* — Eva Puente
(74) *Attorney, Agent, or Firm* — William Park & Associates Ltd.

(57) ABSTRACT

A semiconductor apparatus includes a transmission block and a reception block. The transmission block may convert an input signal into two or more synchronization signals, some bits of which have longer data valid windows than the other bits, and output the two or more synchronization signals. The reception block may generate the output signal by capturing bits having longer data valid windows between the two or more synchronization signals.

18 Claims, 5 Drawing Sheets

SEMICONDUCTOR APPARATUS AND SYSTEM

CROSS-REFERENCES TO RELATED APPLICATION

The present application claims priority under 35 U.S.C. §119(a) to Korean application number 10-2014-0180333 filed on Dec. 15, 2014, in the Korean Intellectual Property Office, which is incorporated herein by reference in its entirety.

BACKGROUND

1. Technical Field

Embodiments of the present invention generally relate to a semiconductor integrated circuit, and more particularly to a semiconductor apparatus.

2. Related Art

When a semiconductor apparatus communicates with other devices, it transmits and receives electrical signals.

A synchronous semiconductor apparatus has a synchronous interface maintaining a fixed timing relationship between the synchronous semiconductor apparatus and other devices.

The synchronous semiconductor apparatus may use a clock signal for signal transmission.

Signal transmission via long signal lines may cause propagation delays, which vary according to the lengths of the signal lines.

When the synchronous semiconductor apparatus uses the clock signal for signal transmission, the length variation between various signal lines may cause error in capturing the signals.

SUMMARY

In an embodiment, a semiconductor apparatus may include: a transmission block configured to output an input signal as a rising synchronization signal during a low period of a clock, and output the input signal as a falling synchronization signal during a high period of the clock; and a reception block configured to output the rising synchronization signal as an output signal during the high period of the clock, and output the falling synchronization signal as the output signal during the low period of the clock.

In an embodiment, a semiconductor apparatus may include: a transmission block configured to generate a rising synchronization signal and a falling synchronization signal from an input signal in synchronization with a clock; and a reception block configured to receive the rising synchronization signal and the falling synchronization signal, and generate an output signal, wherein respective bits of the rising synchronization signal and the falling synchronization signal have valid periods of different magnitudes, and respective bits of the input signal and the output signal have valid periods of the same magnitude.

In an embodiment, a semiconductor apparatus may include: a plurality of semiconductor dies stacked over a base die; a controller electrically coupled with the base die; and a direct access ball electrically coupled to the base die through a substrate, wherein the base die includes a first input/output circuit block which transmits and receives signals to and from the controller, and a second input/output circuit block which transmits and receives signals to and from the direct access ball, wherein the second input/output circuit block converts signals with windows of the same magnitude received from the direct access ball, into signals with windows of different magnitudes, and outputs converted signals, and wherein the first input/output circuit block receives output signals of the second input/output circuit block, and outputs signals with windows of the same magnitude, to the stacked semiconductor dies.

DETAILED DESCRIPTION

Figure 1:
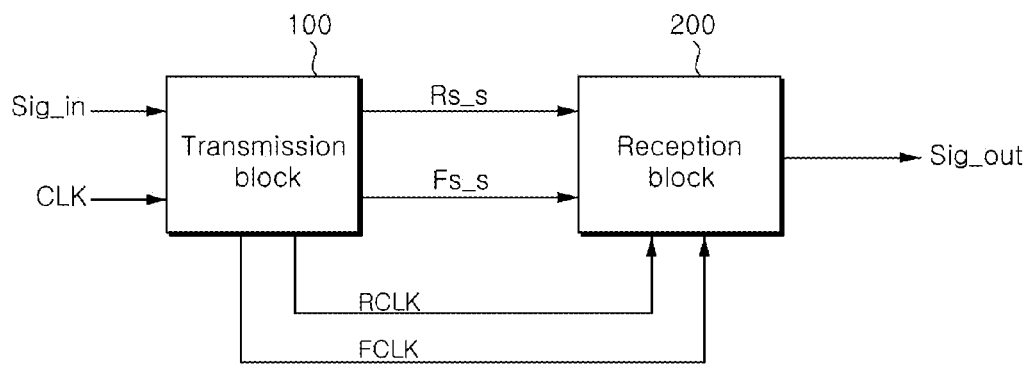
FIG. 1 is a configuration diagram illustrating an example of a semiconductor apparatus in accordance with an embodiment.

FIG. 1 is a configuration diagram illustrating an example of a semiconductor apparatus in accordance with an embodiment of the present invention.

As shown in FIG. 1, a semiconductor apparatus in accordance with an embodiment includes a transmission block 100 and a reception block 200.

The transmission block 100 may output an input signal Sig_in, which is inputted during a low period of a clock CLK, as a rising synchronization signal Rs_s, and output the input signal Sig_in, which is inputted during a high period of the clock CLK, as a falling synchronization signal Fs_s. The transmission block 100 may retain the level of the rising synchronization signal Rs_s regardless of the input signal Sig_in during the high period of the clock CLK, and retain the level of the falling synchronization signal Fs_s regardless of the input signal Sig_in during the low period of the clock CLK. Also, the transmission block 100 may generate a falling clock FCLK, which has a phase opposite to the phase of the clock CLK, and a rising clock RCLK, which has the same phase as the clock CLK.

The reception block 200 may output the rising synchronization signal Rs_s as an output signal Sig_out during the high period of the clock CLK, and output the falling synchronization signal Fs_s as the output signal Sig_out during the low period of the clock CLK. For example, the reception block 200 may output the rising synchronization signal Rs_s as the output signal Sig_out during a high period of the rising clock RCLK, and output the falling synchronization signal Fs_s as the output signal Sig_out during a high period of the falling clock FCLK.

For example, the transmission block 100 may convert the input signal into the rising synchronization signal Rs_s and the falling synchronization signal Fs_s, and output the rising synchronization signal Rs_s, a first bit of which has a longer data valid window than a second bit, and the falling synchronization signal Fs_s, a second bit of which has a longer data valid window than a first bit, and the reception may output the rising synchronization signal Rs_s as the output signal Sig_out by capturing the first bit, and output the falling synchronization signal Fs_s as the output signal Sig_out by capturing the second bit.

Figure 2:
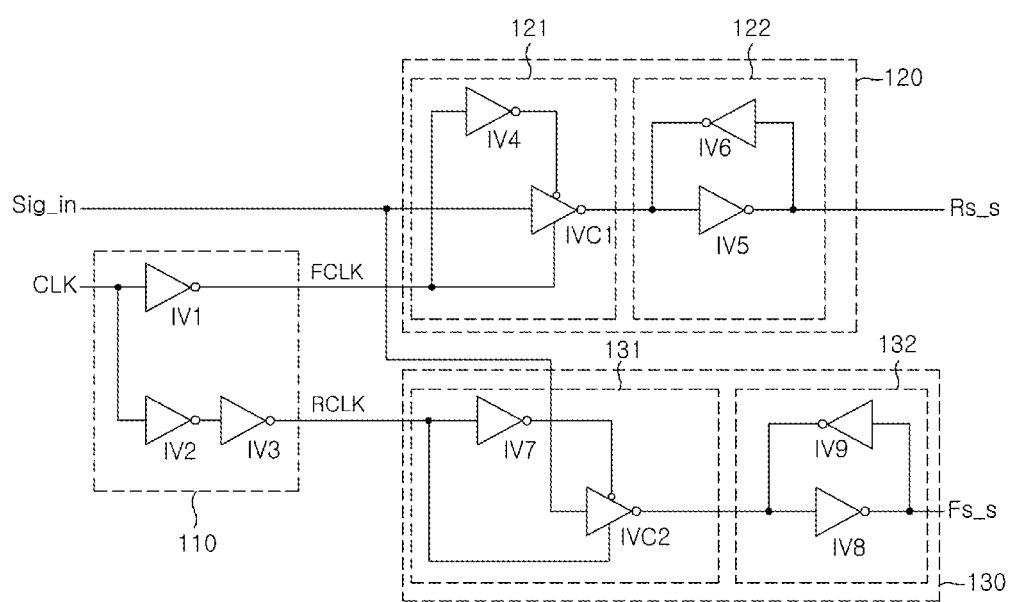
FIG. 2 is a configuration diagram illustrating an example of the transmission block shown in FIG. 1.

As shown in FIG. 2, the transmission block 100 may include a clock generation unit 110, and first and second latch units 120 and 130.

The clock generation unit 110 may receive the clock CLK, and generate the rising clock RCLK and the falling clock FCLK.

The clock generation unit 110 may include first to third inverters IV1, IV2 and IV3. The first inverter IV1 may generate the falling clock FCLK by inverting the clock CLK. The second and third inverters IV2 and IV3, which are coupled in series, may generate the rising clock RCLK, whose phase is the same as the clock CLK.

The first latch unit 120 may receive the input signal Sig_in and output the rising synchronization signal Rs_s. The first latch unit 120 may output the rising synchronization signal Rs_s having a certain logic level during the high period of the falling clock FCLK, and retain the level of the rising synchronization signal Rs_s regardless of the input signal Sig_in during the low period of the falling clock FCLK.

The first latch unit 120 may include a first switching section 121, and a first signal retaining section 122.

The first switching section 121 may transfer the input signal Sig_in to the first signal retaining section 122 only during the high period of the falling clock FCLK.

The first switching section 121 may include a fourth inverter IV4 and a first control inverter IVC1. The fourth inverter IV4 may receive the falling clock FCLK, and output an inverted falling clock FCLK. The first control inverter IVC1 may receive the output of the fourth inverter IV4 (e.g., an inverted falling clock FCLK) through a first control terminal, the falling clock FCLK through a second control terminal, and the input signal Sig_in through an input terminal.

The first signal retaining section 122 may store an output of the first switching section 121, and output the rising synchronization signal Rs_s.

The first signal retaining section 122 may include fifth and sixth inverters IV5 and IV6, which are coupled sequentially in a loop. The fifth inverter IV5 may receive the output of the first switching section 121, and output the rising synchronization signal Rs_s. The sixth inverter IV6 may receive an output of the fifth inverter IV5, and the fifth inverter IV5 may receive an output of the sixth inverter IV6.

The second latch unit 130 receives the input signal Sig_in and may output the falling synchronization signal Fs_s during the high period of the rising clock RCLK, and retain the level of the falling synchronization signal Fs_s regardless of the input signal Sig_in during the low period of the rising clock RCLK.

The second latch unit 130 may include a second switching section 131, and a second signal retaining section 132.

The second switching section 131 may transfer the input signal Sig_in to the second signal retaining section 132 only during the high period of the rising clock RCLK.

The second switching section 131 may include a seventh inverter IV7 and a second control inverter IVC2. The seventh inverter IV7 may receive the rising clock RCLK, and output an inverted rising clock RCLK. The second control inverter IVC2 may receive the output of the seventh inverter IV7 (e.g., an inverted rising clock RCLK) through a first control terminal, the rising clock RCLK through a second control terminal, and the input signal Sig_in through an input terminal.

The second signal retaining section 132 may store an output of the second switching section 131, and output the falling synchronization signal Fs_s.

The second signal retaining section 132 may include eighth and ninth inverters IV8 and IV9, which are coupled sequentially in a loop. The eighth inverter IV8 may receive the output of the second switching section 131, and output the falling synchronization signal Fs_s. The ninth inverter IV9 may receive an output of the eighth inverter IV8, and the eighth inverter IV8 may receive an output of the ninth inverter IV9.

Figure 3:
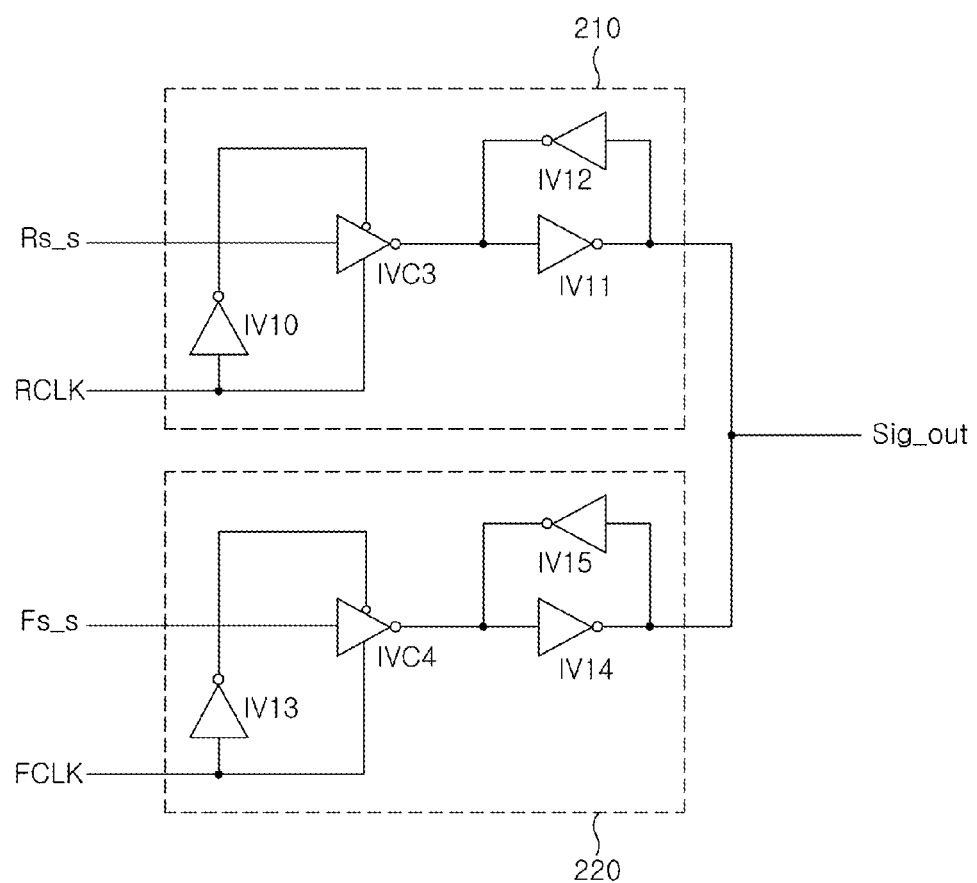
FIG. 3 is a configuration diagram illustrating an example of the reception block shown in FIG. 1.

As shown in FIG. 3, the reception block 200 may include a first synchronization signal selective output unit 210, and a second synchronization signal selective output unit 220.

The first synchronization signal selective output unit 210 may output the rising synchronization signal Rs_s as the output signal Sig_out during the high period of the rising clock RCLK.

The first synchronization signal selective output unit 210 may include tenth to twelfth inverters IV10, IV11 and IV12, and a third control inverter IVC3. The tenth inverter IV10 may receive the rising clock RCLK, and output an inverted rising clock RCLK. The third control inverter IVC3 may receive an output of the tenth inverter IV10 (e.g., an inverted rising clock RCLK) through a first control terminal, the rising clock RCLK through a second control terminal, and the rising synchronization signal Rs_s through an input terminal. The eleventh inverter IV11 may receive an output of the third control inverter IVC3, and output the output signal Sig_out. The twelfth inverter IV12 may receive an output of the eleventh inverter IV11 (e.g., the output signal Sig_out), and the eleventh inverter IV11 may receive an output of the twelfth inverter IV12.

The second synchronization signal selective output unit 220 may output the falling synchronization signal Fs_s as the output signal Sig_out during the high period of the falling clock FCLK.

The second synchronization signal selective output unit 220 may include thirteenth to fifteenth inverters IV13, IV14 and IV15, and a fourth control inverter IVC4. The thirteenth inverter IV13 may receive the falling clock FCLK, and output an inverted falling clock FCLK. The fourth control inverter IVC4 may receive an output of the thirteenth inverter IV13 (e.g., an inverted falling clock FCLK) through a first control terminal, the falling clock FCLK through a second control terminal, and the falling synchronization signal Fs_s through an input terminal. The fourteenth inverter IV14 may receive an output of the fourth control inverter IVC4, and output the output signal Sig_out. The fifteenth inverter IV15 may receive an output of the fourteenth inverter IV14 (e.g., the output signal Sig_out), and the fourteenth inverter IV14 may receive an output of the fifteenth inverter IV15.

Figure 4:
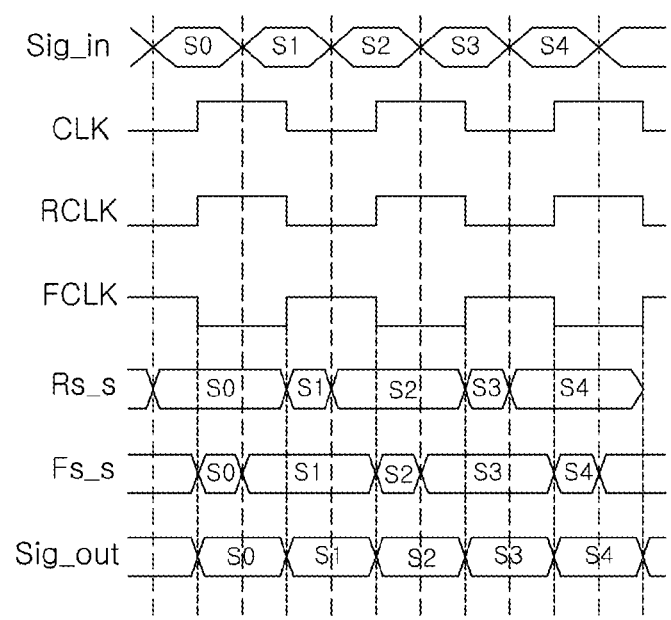
FIG. 4 is a timing diagram to provide an overall description of the timing relationships between signals and clocks in accordance with an embodiment.

FIG. 4 is a timing diagram to provide an overall description of the timing relationships between signals and clocks in accordance with an embodiment of the present invention.

Operations of the semiconductor apparatus in accordance with an embodiment will be described below with reference to FIG. 4.

The input signal Sig_in is inputted to the transmission block 100 in synchronization with the clock CLK. Data bits S0, S1, S2, S3 and S4 of the input signal Sig_in inputted to the transmission block 100 may have the same data valid windows as each other, which may be equal to a pulse width of the clock CLK (e.g., half a period of the clock CLK).

The clock generation unit 110 of the transmission block 100 may generate the falling clock FCLK which has a phase opposite to the clock CLK, and the rising clock RCLK which has the same phase as the clock CLK.

The first latch unit 120 of the transmission block 100 may output the input signal Sig_in as the rising synchronization signal Rs_s during the high period of the falling clock FCLK. The first latch unit 120 may retain the level of the rising synchronization signal Rs_s regardless of the input signal Sig_in during the low period of the falling clock FCLK.

In a case where data bits S0, S1, S2, S3 and S4 of the input signal Sig_in, which have the same data valid windows as each other, are inputted in series, the first latch unit 120 may shift the logic level of the rising synchronization signal Rs_s if the logic level of the input signal Sig_in is shifted during the high period of the falling clock FCLK, and retain the logic level of the rising synchronization signal Rs_s even if the value of the input signal Sig_in is shifted during the low period of the falling clock FCLK.

Data valid windows of bits S0, S2 and S4 of the rising synchronization signal Rs_s, which overlap with the low period of the falling clock FCLK, are longer than data valid windows of bits S1 and S3 of the rising synchronization signal Rs_s.

The second latch unit 130 of the transmission block 100 may output the input signal Sig_in as the falling synchronization signal Fs_s during the high period of the rising clock RCLK. The second latch unit 130 may retain the level of the falling synchronization signal Fs_s regardless of the input signal Sig_in during the low period of the rising clock RCLK.

In an case where data bits S0, S1, S2, S3 and S4 of the input signal Sig_in, which have the same data valid windows as each other, are inputted in series, the second latch unit 130 may shift the logic level of the falling synchronization signal Fs_s if the logic level of the input signal Sig_in is shifted during the high period of the rising clock RCLK, and retain the logic level of the falling synchronization signal Fs_s even if the value of the input signal Sig_in is shifted during the low period of the rising clock RCLK.

Data valid windows of bits S1 and S3 of the falling synchronization signal Fs_s, which overlap with the low period of the rising clock RCLK, are longer than data valid windows of bits S0, S2 and S4 of the falling synchronization signal Fs_s.

The reception unit 200 may output the rising synchronization signal Rs_s as the output signal Sig_out during the high period of the rising clock RCLK, and output the falling synchronization signal Fs_s as the output signal Sig_out during the high period of the falling clock FCLK.

Referring to FIG. 3, the first synchronization signal selective output unit 210 of the reception block 200 may output the rising synchronization signal Rs_s as the output signal Sig_out during the high period of the rising clock RCLK. The second synchronization signal selective output unit 220 of the reception block 200 may output the falling synchronization signal Fs_s as the output signal Sig_out during the high period of the falling clock FCLK.

As a result, the reception unit 200 may generate as the output signal Sig_out by using the rising synchronization signal Rs_s whose bits S0, S2 and S4 have longer data valid windows than bits S1 and S3, and the falling synchronization signal Fs_s whose bits S1 and S3 have longer data valid windows than bits S0, S2 and S4.

The semiconductor apparatus in accordance with an embodiment may include a transmission block and a reception block. The transmission block may convert the input signal Sig_in into two synchronization signals, some bits of which have longer data valid windows than the other bits, and output the two synchronization signals. The reception block may generate the output signal Sig_out whose bits have the same data valid windows as each other by using bits having longer data valid windows between the two synchronization signals outputted from the transmission block. When consecutive bits of one of the two synchronization signals are "long data valid window" and "short data valid window," consecutive bits of the other of the two synchronization signals may be "short data valid window" and "long data valid window.". The reception block may output only the bits having long data valid window between the two synchronization signals as the output signal Sig_out.

In the semiconductor apparatus in accordance with the embodiment, therefore, even if the distance between the transmission block and the reception block increases, more reliable output signal Sig_out may be generated by selecting bits having long data valid window.

Figure 5:
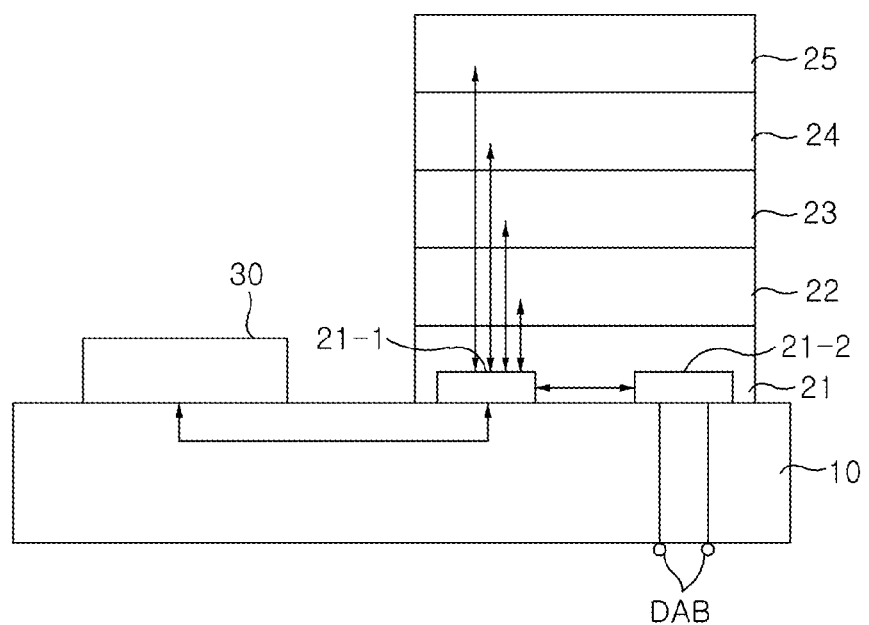
FIG. 5 is a representation of a semiconductor apparatus in accordance with an embodiment.

The semiconductor apparatus in accordance with an embodiment may be applied to a semiconductor apparatus having stacked semiconductor chips as shown in FIG. 5.

The stacked semiconductor apparatus may include a plurality of semiconductor dies 22, 23, 24 and 25 which are stacked on a base die 21, a controller 30 which is electrically coupled to the base die 21 through a substrate 10, and direct access balls DAB which are electrically coupled to the base die 21 through the substrate 10. The base die 21 may include a first input/output circuit block 21-1 which transmits and receives signals to and from the controller 30, and a second input/output circuit block 21-2 which transmits and receives signals to and from the direct access balls DAB. The second input/output circuit block 21-2 may convert signals received from the direct access balls DAB into at least two kinds of signals. The second input/output circuit block 21-2 may convert signals, each bit of which has the same data valid window, into signals, some bits of which have longer data valid windows than the other bits. The first input/output circuit block 21-1 may receive the outputs of the second input/output circuit block 21-2, and output the signals, each bit of which has the same data valid window, to the stacked semiconductor dies 22, 23, 24 and 25.

The second input/output circuit block 21-2 may convert signals which are received from the direct access balls DAB and have the same data valid windows into synchronization signals which have different data valid windows in response to a clock, and output the converted signals.

The second input/output circuit block 21-2 may include the transmission block 100 shown in FIG. 2.

The second input/output circuit block 21-2 may include a clock generation unit 110, and first and second latch units 120 and 130.

The clock generation unit 110 may split the clock received from the direct access ball DAB into a rising clock and a falling clock.

The first latch unit 120 may output the input signal received from the direct access ball DAB as a rising synchronization signal during the high period of the falling clock, and retain the level of the rising synchronization signal during the low period of the falling clock.

The second latch unit 130 may output the input signal received from the direct access ball DAB as a falling synchronization signal during the high period of the rising clock, and retain the level of the falling synchronization signal during the low period of the rising clock.

The first input/output circuit block 21-1 may receive the rising synchronization signal and the falling synchronization signal, which have different data valid windows from one another, from the second input/output circuit block 21-2.

The first input/output circuit block 21-1 may include the reception block 200 shown in FIG. 3.

The first input/output circuit block 21-1 may output the rising synchronization signal as an output signal to the plurality of semiconductor dies 22, 23, 24 and 25 during the high period of the rising clock, and output the falling synchronization signal as the output signal to the plurality of semiconductor dies 22, 23, 24 and 25 during the high period of the falling clock. The first input/output circuit block 21-1 may output signals, each bit of which has the same data valid windows to the plurality of semiconductor dies 22, 23, 24 and 25.

If a plurality of semiconductor dies are stacked on a base die and a controller and the base die are stacked on a substrate, the base die may include a first input/output circuit block for signal transmission between the controller and the stacked semiconductor dies. In order to control the stacked semiconductor dies without the controller, direct access balls are formed on the substrate. The base die may include a second input/output circuit block for signal transmission between the direct access balls and the first input/output circuit block. Signal transmission from the direct access balls to the stacked semiconductor dies may cause propagation delays, which vary according to the lengths of the signal lines, and the length variation between various signal lines may cause error in capturing the signals at a high speed.

In an embodiment of the present invention, a transmission block may be formed in the second input/output circuit block, and a reception block may be formed in the first input/output circuit block, thereby reducing errors in capturing the signals.

While various embodiments have been described above, it will be understood to those skilled in the art that the embodiments described are by way of example only. Accordingly, the semiconductor apparatus described herein should not be limited based on the described embodiments.

What is claimed is:

1. A semiconductor apparatus comprising:
   a transmission block configured to convert an input signal into two or more synchronization signals, some bits of which have longer data valid windows than the other bits, and output the two or more synchronization signals; and
   a reception block configured to generate the output signal by capturing bits having longer data valid windows between the two or more synchronization signals,
   wherein the transmission block alternately outputs the some bits and the other bits in series,
   wherein the transmission block is configured to convert the input signal into a rising synchronization signal and a falling synchronization signal, and output the rising synchronization signal, a first bit of which has a longer data valid window than a second bit, and the falling synchronization signal, a second bit of which has a longer data valid window than a first bit, and the reception block is configured to output the rising synchronization signal as an output signal by capturing the first bit, and output the falling synchronization signal as the output signal by capturing the second bit.

2. The semiconductor apparatus according to claim 1, wherein the transmission block comprises:
   a clock generation unit configured to receive the clock, and generate a falling clock and a rising clock;
   a first latch unit configured to receive and store the input signal during a high period of the falling clock, and output the rising synchronization signal; and
   a second latch unit configured to receive and store the input signal during a high period of the rising clock, and output the falling synchronization signal.

3. The semiconductor apparatus according to claim 2, wherein a phase of the falling clock and a phase of the rising clock are opposite to each other.

4. The semiconductor apparatus according to claim 2, wherein the first latch unit receives and stores the input signal having a certain logic level during the high period of the falling clock, and retains the logic level of the stored signal during a low period of the falling clock.

5. The semiconductor apparatus according to claim 2, wherein the second latch unit receives and stores the input signal having a certain logic level during the high period of the rising clock, and retains the logic level of the stored signal during a low period of the rising clock.

6. The semiconductor apparatus according to claim 1,
   wherein the reception block receives the rising synchronization signal during the high period of the rising clock, and outputs the output signal, and
   wherein the reception block receives the falling synchronization signal during the high period of the falling clock, and outputs the output signal.

7. The semiconductor apparatus according to claim 1, wherein the transmission block comprises:
   a splitter configured to receive the clock, and generate a rising clock and a falling clock;
   a first latch unit configured to generate the rising synchronization signal by receiving and storing the input signal during a high period of the falling clock and retaining a latched signal during a low period of the falling clock; and
   a second latch unit configured to generate the falling synchronization signal by receiving and storing the input signal during a high period of the rising clock and retaining a latched signal during a low period of the rising clock.

8. The semiconductor apparatus according to claim 7, wherein the first latch unit comprises:
   a switching section configured to output the input signal during the high period of the falling clock; and
   a signal retaining section configured to latch an output of the switching section, and output the rising synchronization signal.

9. The semiconductor apparatus according to claim 7, wherein the second latch unit comprises:
   a switching section configured to output the input signal during the high period of the rising clock; and
   a signal retaining section configured to latch an output of the switching section, and output the falling synchronization signal.

10. A semiconductor apparatus comprising:
    a plurality of semiconductor dies stacked over a base die;
    a controller electrically coupled to the base die; and
    a direct access ball electrically coupled to the base die through a substrate,
    wherein the base die includes a first input/output circuit block which transmits and receives signals to and from the controller, and a second input/output circuit block which transmits and receives signals to and from the direct access ball,
    wherein the second input/output circuit block converts signals, which are received from the direct access ball and each bit of which has the same data valid window as each other, into at least two kinds of signals, some bits of which have longer data valid windows than the other bits, and outputs the converted signals, and wherein the first input/output circuit block receives output signals of the second input/output circuit block, and outputs signals, each bit of which has the same data valid window as each other, by capturing bits having longer data valid windows than the other bits.

11. The semiconductor apparatus according to claim 10, wherein the second input/output circuit block converts signals, which are received from the direct access ball and each bit of which has the same data valid window as each other, into synchronization signals, some bits of which have longer data valid windows than the other bits, in response to a clock, and outputs the converted signals.

12. The semiconductor apparatus according to claim 11, wherein the synchronization signals include a rising synchronization signal and a falling synchronization signal, and
wherein the second input/output circuit block comprises:
a first latch unit configured to receive a signal inputted from the direct access ball and output the rising synchronization signal having a certain logic level during a high period of the clock, and retain a level of the rising synchronization signal during a low period of the clock; and
a second latch unit configured to receive the signal inputted from the direct access ball and output the falling synchronization signal having a certain logic level during the low period of the clock, and retain a level of the falling synchronization signal during the high period of the clock.

13. The semiconductor apparatus according to claim 12, wherein the first input/output circuit block outputs the rising synchronization signal as an output signal during the high period of the clock, and outputs the falling synchronization signal as the output signal during the low period of the clock.

14. A system comprising:
a transmission block configured to convert an input signal into two or more synchronization signals, some bits of which have longer data valid windows than the other bits, and output the two or more synchronization signals; and
a reception block configured to generate the output signal by capturing bits having longer data valid windows between the two or more synchronization signals,
wherein the transmission block alternately outputs the some bits and the other bits in series,
wherein the transmission block is configured to convert the input signal into a rising synchronization signal and a falling synchronization signal, and output the rising synchronization signal, a first bit of which has a longer data valid window than a second bit, and the falling synchronization signal, a second bit of which has a longer data valid window than a first bit.

15. The system according to claim 14, wherein the reception block is configured to output a rising synchronization signal, a first bit of which has a longer data valid window than a second bit, as an output signal by capturing the first bit, and output a falling synchronization signal, a second bit of which has a longer data valid window than a first bit, as the output signal by capturing the second bit.

16. The system according to claim 14, wherein the transmission block comprises:
a splitter configured to receive the clock, and generate a rising clock and a falling clock;
a first latch unit configured to generate a rising synchronization signal by receiving and storing the input signal during a high period of the falling clock and retaining a latched signal during a low period of the falling clock; and
a second latch unit configured to generate a falling synchronization signal by receiving and storing the input signal during a high period of the rising clock and retaining a latched signal during a low period of the rising clock.

17. The system according to claim 16, wherein the first latch unit comprises:
a switching section configured to output the input signal during the high period of the falling clock; and
a signal retaining section configured to latch an output of the switching section, and output the rising synchronization signal.

18. The system according to claim 16, wherein the second latch unit comprises:
a switching section configured to output the input signal during the high period of the rising clock; and
a signal retaining section configured to latch an output of the switching section, and output the falling synchronization signal.

* * * * *